United States Patent
Sasaki

[11] Patent Number: 6,156,631
[45] Date of Patent: Dec. 5, 2000

[54] METHOD OF MANUFACTURING SEMICONDUCTOR DEVICE

[75] Inventor: Makoto Sasaki, Tokyo, Japan

[73] Assignee: NEC Corporation, Tokyo, Japan

[21] Appl. No.: 08/924,313

[22] Filed: Sep. 5, 1997

[30] Foreign Application Priority Data

Sep. 6, 1996 [JP] Japan ..................... 8-236213

[51] Int. Cl.⁷ ............ H01L 21/4763; H01L 21/311
[52] U.S. Cl. ............ 438/585; 438/697; 438/699; 438/633
[58] Field of Search .................. 438/585, 592, 438/692, 693, 697, 699, 782, 633

[56] References Cited

U.S. PATENT DOCUMENTS

| | | |
|---|---|---|
| 5,324,689 | 6/1994 | Yoo . |
| 5,324,690 | 6/1994 | Gelatos et al. . |
| 5,346,587 | 9/1994 | Doan et al. . |
| 5,543,356 | 8/1996 | Horiuchi . |
| 5,654,227 | 8/1997 | Gonzalez et al. . |
| 5,858,865 | 1/1999 | Juengling et al. . |

FOREIGN PATENT DOCUMENTS

| | | |
|---|---|---|
| 0 568 475 A1 | 11/1993 | European Pat. Off. . |
| 3-196632 | 8/1991 | Japan . |
| 5-251383 | 9/1993 | Japan . |
| 8-213612 | 8/1996 | Japan . |
| 8-340113 | 12/1996 | Japan . |
| 9-172168 | 6/1997 | Japan . |

OTHER PUBLICATIONS

English translation of Japanese Office Action dated Mar. 16, 1999 (Hei 11).

Japanese Office Action dated Oct. 6, 1998 with English language translation of Japanese Examiner' comments.

*Primary Examiner*—John F. Niebling
*Assistant Examiner*—Ron Pompey
*Attorney, Agent, or Firm*—McGuireWoods, LLP

[57] ABSTRACT

In a patterning of a gate electrode by an optical lithography, a narrowing of a pattern and a change in sizes are prevented at a step of a polycrystalline silicon. A silicon nitride 17 is formed, as an impact-absorbing film, on a polycrystalline silicon 16 to be the gate electrode. The silicon nitride 17 is leveled by a chemical mechanical polishing method. A resist 18 is then applied. The optical lithography is performed. The resist 18 is used as a mask so that the polycrystalline silicon 16 is anisotropic etched to form a gate electrode.

16 Claims, 3 Drawing Sheets

METHOD OF MANUFACTURING SEMICONDUCTOR DEVICE

BACKGROUND OF THE INVENTION (i) Field of the Invention

The present invention relates to a method of manufacturing a semiconductor device and, more specifically, to an improvement in step of patterning a conductive layer over an uneven surface to thereby form a gate electrode.

(ii) Description of the Related Art

In a process of manufacturing a semiconductor device, a selective etching, a local oxidation or the like causes various steps to be formed on a semiconductor substrate. The surface of the substrate is thereby made uneven. It is required in a process of a device to perform a patterning of a conductive layer such as a polysilicon layer to form a wiring layer and/or a gate electrode. If such patterning is performed on a conductive layer deposited over the uneven surface, the patterned layer for a wiring layer or a gate layer is partially made narrow at the steps of the uneven surface, or is differentiated in size between upper and lower portions thereof.

Referring now to FIG. 3 and further to FIG. 4 which is a cross sectional view taken along line C–C' of FIG. 3, a field insulating layer 14 is selectively formed in the surface portion of a semiconductor substrate 11 to define an element formation area. Since the layer 14 is formed by selectively oxidizing the substrate 11, there is formed a step at the edge of the film 14. The element formation area is covered by a gate insulating film 15. In order to form a gate electrode, a polycrystalline silicon layer 16 is formed and further a photoresist layer 18 is formed.

As is apparent from FIG. 4, the resist layer 18 is varied in thickness at the step. That is, the resist film thickness of the step upper portion is different from that of the lower portion. For this reason due to a standing-wave effect in the photolithography step, the actual pattern of the polycrystalline silicon layer 16 is narrowed in the step of the oxide layer 14, as shown in FIG. 3. The gate electrode, which is made of the layer 16 by selective etching using the photoresist 18 as a mask, is thus also made narrow at the step. A transistor having the gate electrode thus formed easily suffers from a punch-through phenomenon at the narrow portion of the gate electrode due to the so-called short channel effect.

One of means for solving the the above problem is disclosed in U.S. Pat. No. 5,346,587. The method tight by this patent is explained below with reference to FIG. 5.

As shown in FIG. 5A, a field insulating layer 14 is selectively formed on a silicon substrate 11 to define an element isolation area A and an element formation area B. A polycrystalline silicon layer 16 is then deposited with 300 nm in thickness over the entire surface. Before that, a gate insulating film 15 is formed to cover the area B of the semiconductor substrate 11. Due to the formation of the layer 14, there is a step on the boundary portion between the element area B and the element separation area A. The step is about 100 nm. The surface of the polysilicon layer 16 is thereby made uneven.

Thereafter, a chemical mechanical polishing (CMP) is performed on the layer 16 to remove the step and make the surface thereof even, as shown in FIG. 5B. The photolithograph process is then performed to selectively etch the the polysilicon layer 16 to form a gate electrode. At this time, the surface of the polycrystalline silicon 16 is even, and the gate electrode is not substantially made narrow at the step.

However, according to this method, the polycrystalline silicon layer 16 to be the gate electrode is directly polished by the CMP. On the other hand, the amount of the polysilicon layer which has disappeared by the CMP changes considerably in accordance with the position of the wafer. For this reason, the film thickness of the polycrystalline silicon does not have a uniformity on the wafer surface. The dispersion is up to about 30 nm within the range on the surface.

In an nMOSFET, for example, when an arsenic is doped into the gate, the arsenic is not diffused all over the gate electrode at a thicker portion of the gate electrode, and thus the gate electrode is depleted. Conversely, in a pMOSFET, for example, a boron is protruded from the gate insulating film at a thinner portion of the gate electrode, and thus the boron is doped into a channel area. Due to this depletion of the gate electrode and protrusion of an impurity, when the film thickness dispersion of the gate electrode is present on the wafer surface, transistor characteristics are dispersed on the wafer surface.

BRIEF SUMMARY OF THE INVENTION

It is an object of the present invention to provide a method of manufacturing a semiconductor device in which patterning of a conductive layer such as a polysilicon layer can be performed uniformly.

A method of manufacturing a semiconductor device according to the present invention comprises the steps of depositing an conductive layer on a semiconductor wafer, covering the conductive layer with a buffer impact-absorbing or buffer layers, planarizing or leveling the surface of the impact-absorbing or buffer film, and patterning the impact-absorbing layer and the conductive layer.

It is preferable to perform the planarizing step by a chemical mechanical polishing (CMP). The conductive layer may be a polycrystalline silicon, an amorphous silicon, a phosphorous doped silicon, or a boron doped silicon. It is favorable to use a silicon nitride layer as the buffer layer. As other materials for the impact-absorbing film, a high melting point or refractory metal film such as Mo, Ti, W, Co, or a refractory metal silicide layer such as Mo silicide, Ti silicide, W silicide or Co silicide can be used.

According to the present invention, the planarizing or leveling is performed on the impact-absorbing film, not the conductive layer. Accordingly, the patterning by the optical lithography causes no narrowing of a pattern, nor a change in sizes are absent. In addition, since the impact-absorbing film is leveled, a film thickness of the gate electrode is kept constant.

BRIEF DESCRIPTION OF THE DRAWINGS

The above and other objects, features and advantages of the present invention will be made apparent from the following description taken in conjunction with the accompanying drawings, in which.

DETAILED DESCRIPTION OF THE INVENTION

Figure 1A:
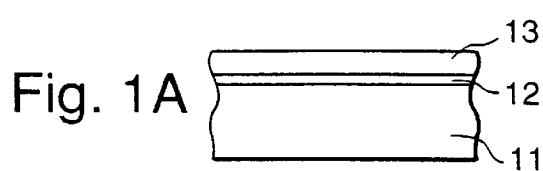
FIGS. 1A to FIG. 1H are cross sectional views showing the respective steps of a first embodiment of the present invention.

Referring now to FIG. 1, the first embodiment of the present invention includes the following steps:

Specifically, a thermal oxidization film 12 having 20 nm in thickness is formed on a silicon substrate 11 as a semiconductor substrate 11, and a silicon nitride film 13 is then deposited with 150 nm in thickness, as shown in FIG. 1A.

Figure 1E:
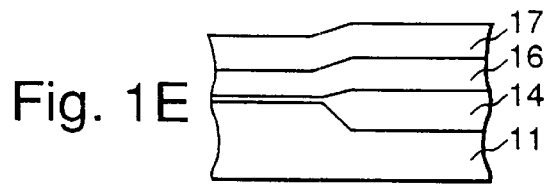
Figure 1B:

Next, in order to form an element separation area, as shown in FIG. 1B, a lithography technique is used so as to perform an anisotropic etching to the silicon nitride film 13 and the oxide film 12 at a portion which is to be formed as the element separation area. In addition, the silicon substrate 11 is anisotropic etched to 40 nm in thickness.

Next, the substrate 11 is selectively oxidized by using the nitride film 13 as a mask. As shown in FIG. 1C, consequently, a thick oxide film 14 is formed on an element separation area A. The nitride film 13 and oxide film 12 are then removed, so that a step having about 100 nm in height is formed between the element isolation area A and the element formation area B.

Next, a gate insulating film 15 is formed by a thermal oxidization. A polycrystalline silicon 16 which is to be the gate electrode is deposited with 300 nm in thickness by a CVD over the entire surface, as shown in FIG. 1D. Even after the polycrystalline silicon 16 is deposited, the step remains on a surface of the polycrystalline silicon 16.

As shown in FIG. 1E, a silicon nitride 17 as a buffer or impact-absorbing film is deposited on the polycrystalline silicon 16 with 300 nm in thickness by the CVD.

Figure 1F:
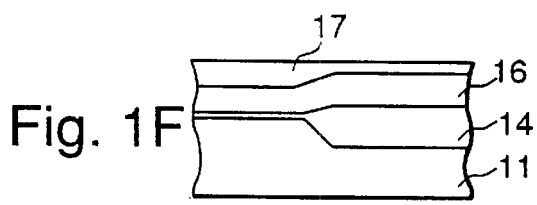
Figure 1C:
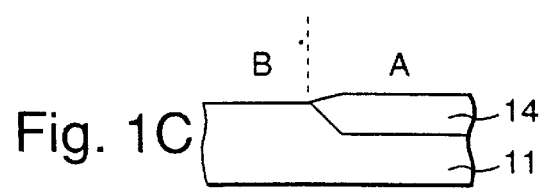

Thereafter, the silicon nitride film 17 is polished to 150 nm in thickness by a CMP to planerize the surface of the film 17, as shown in FIG. 1F. A wafer surface is thus leveled.

Figure 1G:
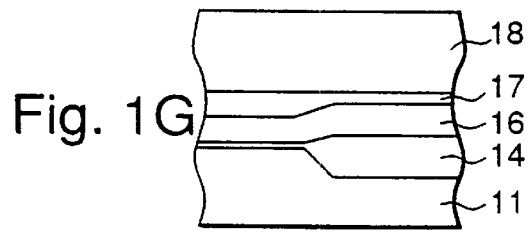
Figure 1D:
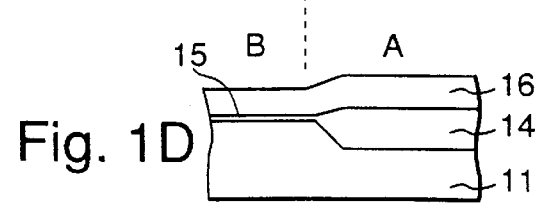

A photoresist layer 18 is then coated on the even surface, as shown in FIG. 1G. Since the base surface is flat, the resist layer 18 has substantially no difference in its film thickness.

Figure 1H:
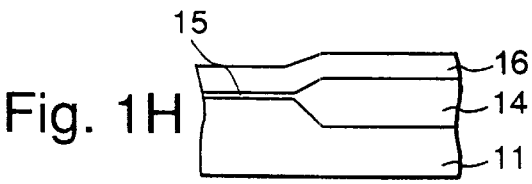

Next, the photolithography technique is used so as to perform the patterning of the resist 18. The resist 18 is used as a mask so that the silicon nitride 17 is anisotropic etched. The resist 18 is then removed. The remaining silicon nitride 17 is used as a mask so that the polycrystalline silicon 16 is anisotropic etched. The silicon nitride 17 is then removed by the wet etching. Thus, as shown in FIG. 1H, the gate electrode composed of a part of the polycrystalline silicon layer 16 is formed.

In the exemplary embodiment, after the silicon nitride 17 is anisotropic etched, the resist 18 is removed. However, after the polycrystalline silicon 16 is selective etched, the resist 18 may be peeled. Finally, the silicon nitride 17 is removed by the wet etching, and the semiconductor device is completed in accordance with a conventional method.

According to the first embodiment, after the silicon nitride 17 is leveled, an optical lithography is used so as to perform the patterning. Therefore, it is possible to prevent a distortion and narrowing of a pattern size of the polycrystalline silicon 16 to be the gate electrode.

In addition, since the silicon nitride 17 is leveled by the CMP, the film thickness dispersion of the poly-crystalline silicon 16, the gate electrode is the same as that during the CVD deposition. Accordingly, a film thickness uniformity of the gate electrode is improved on the wafer surface.

Turning to FIG. 2, the description will be made on a second embodiment of the present invention. The steps shown in FIGS. 2A to 2C are the same as those shown in FIGS. 1A to 1C of the first embodiment.

Figure 2A:
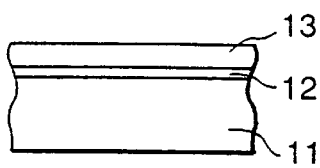
FIGS. 2A to 2H are cross sectional views showing the respective steps of a second embodiment of the present invention.
Figure 2B:
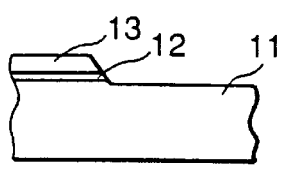
Figure 2C:
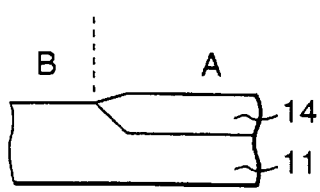
Figure 2D:
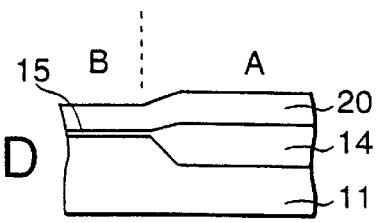

In FIG. 2D, after forming the gate insulating film 15, a phosphorous doped polysilicon layer 20 to be the gate electrode is deposited to 300 nm in thickness by the CVD.

Figure 2E:
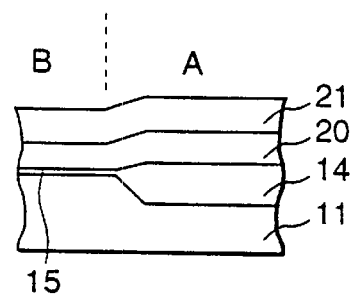

As shown in FIG. 2E, a titanium silicide film 21 as a buffer or impact-absorbing film is deposited on the phosphorous doped polysilicon layer 20 to 300 nm in thickness by a sputtering. A step between the element separation area A and the element area B appears on the titanium silicide 21.

Figure 2F:
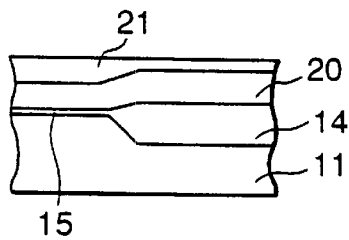
Figure 2G:
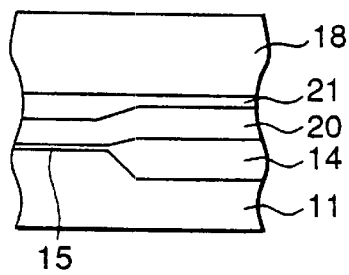
Figure 2H:
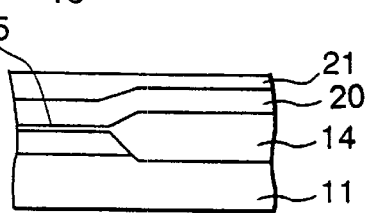
Figure 3:
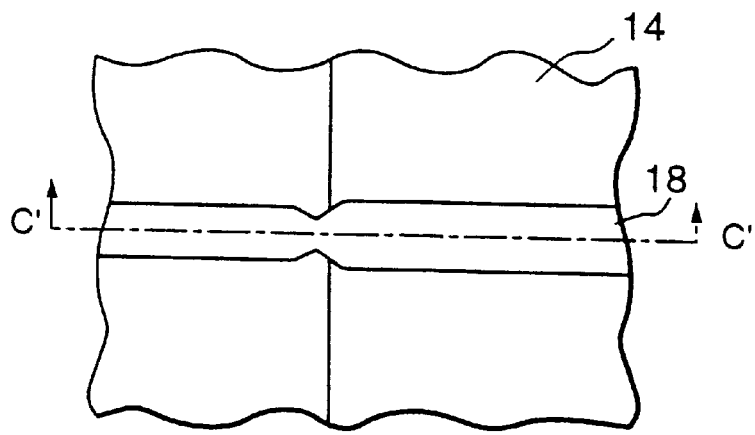
FIG. 3 is a plan view showing a part of a device according to the conventional art.
Figure 4:
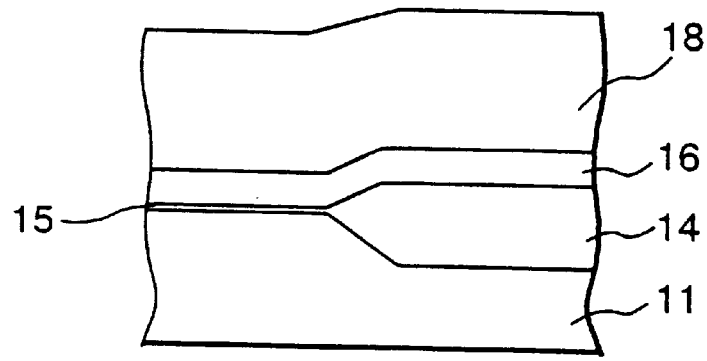
FIG. 4 is a cross sectional view taken along a line C–C' of FIG. 3.
Figure 5A:
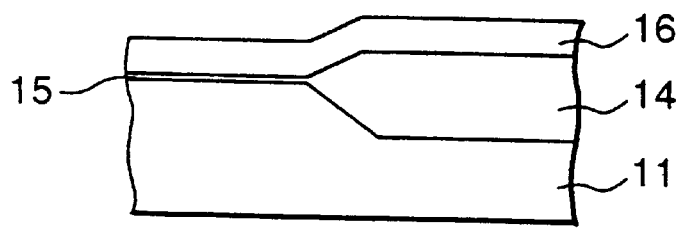
FIGS. 5A and 5B are cross sectional structure views showing the prior art.
Figure 5B:
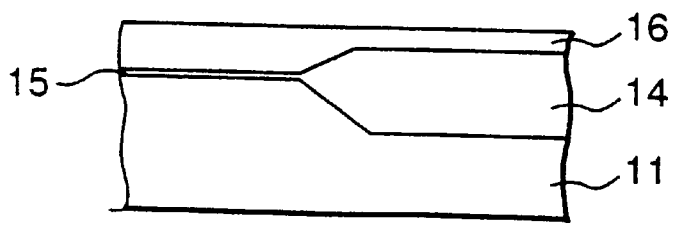

Next, as shown in FIG. 2F, the CMP is used so as to polish the titanium silicide 21 to 150 nm in thickness. The wafer surface is leveled. The photoresist layer 18 is applied on the leveled wafer. A resist pattern is formed on the photoresist layer 18 by the use of the photolithography technique. The resist layer 18 is used as the mask so that the titanium silicide layer 21 is anisotropic etched. Furthermore, the resist layer 18 and the titanium silicide layer 21 are used as the mask so that the phosphorous doped polysilicon layer 20 is anisotropic etched. After the formation of the gate electrode, the resist layer 18 is removed.

In the exemplary embodiment, the titanium silicide layer 21 is used as the impact-absorbing film so as to perform the leveling. Alternatively, the titanium silicide layer 21 may be replaced by other materials which can perform a resistance reduction of the gate electrode, that is, a high melting point metal such as a tungsten. According to the second embodiment, in addition to an effect of the first embodiment, since the titanium silicide, a metal material remains at the upper portion of the gate electrode, the resistance reduction of the gate electrode can be achieved.

According to the present invention as described above, the step can prevent the narrow portion from being formed in the gate electrode. The step can restrain an increase of an off current which is caused by a short channel effect. The reason is as follows. After the wafer surface is leveled, the resist is applied. Accordingly, it is possible to restrain the narrowing and difference of sizes due to the step between the element area and the element separation area.

In addition, a performance dispersion due to a depletion of the gate electrode and a protrusion of an impurity can be restrained on the wafer surface. The reason is as follows. Since the impact-absorbing film disposed at the upper portion of the gate electrode is leveled by the CMP, the gate electrode is not polished. Accordingly, the film thickness of the gate electrode can be constantly maintained.

What is claimed is:

1. A method of manufacturing a semiconductor device comprising the steps of:

depositing a conductive layer over an uneven semiconductor substrate, depositing a silicon nitride buffer layer on said conductive layer, planarizing a surface of said buffer layer, selectively removing said buffer layer to form a mask pattern on said conductive layer, and selectively removing said conductive layer according to said mask pattern.

2. The method according to claim 1, wherein said planarizing step is performed by a chemical-mechanical-polishing.

3. The method according to claim 1, wherein said conductive layer is composed of at least one of a polycrystalline silicon layer, an amorphous silicon layer and a silicon layer doped with impurities.

4. A method of manufacturing a semiconductor device comprising the steps of:

depositing a conductive layer over a semiconductor substrate, depositing a buffer layer on said conductive layer, wherein said buffer layer is one of a high melting point film and a silicide, planarizing a surface of said buffer layer, and patterning said buffer layer and said conductive layer.

5. The method according to claim 4, wherein said high melting point metal film is selected from Mo, Ti, W, and Co, and said silicide film is selected from an Mo silicide, a Ti silicide, a W silicide, and a Co silicide.

6. The method according to claim 1, further comprising:

selectively forming a resist pattern on said planarized surface of said buffer layer and selectively etching said buffer layer according to said resist pattern whereby said buffer layer is selectively removed.

7. A method of manufacturing a semiconductor device comprising the steps of:

depositing a thermal oxidization film on a substrate;

depositing a nitride film on the oxidation film;

etching the nitride film and the thermal oxidization film;

forming an oxide layer on the substrate;

depositing a gate insulating film on the substrate;

depositing a silicon film over the oxide layer and the gate insulating film;

depositing a buffer film on the silicon film, wherein the buffer film is one of a silicon nitride, high melting point film and silicide;

polishing the buffer film and selectively etching the buffer film to form a mask pattern on the silicon film; and etching the silicon film, thereby forming a gate electrode composed of a part of the silicon film.

8. The method according to claim 7, wherein the nitride film is silicon nitride film.

9. The method according to claim 7, further comprising selectively oxidizing the substrate by using the nitride film as a mask.

10. The method according to claim 7, wherein the gate insulating film is formed by a thermal oxidization.

11. The method according to claim 10, wherein the silicon film is polycrystalline silicon and is formed as a gate electrode.

12. The method according to claim 7, further comprising anisotropic etching the buffer film.

13. The method according to claim 9, wherein the silicon film is a phosphorous doped polysilicon layer.

14. The method according to claim 4, further comprising:

anisotropic etching the phosphorous doped polysilicon layer, and using the titanium silicide layer as a mask so as to anisotropic etch the phosphorous doped polysilicon layer.

15. The method according to claim 1, wherein said buffer layer is completely removed.

16. The method according to claim 1, further comprising the steps of:

forming a thermal oxidation layer on the semiconductor substrate, forming a nitride layer on the thermal oxidation layer, anisotropically etching the thermal oxidation layer and the nitride layer in a separation area prior to selectively etching a portion of the semiconductor substrate, forming a thick oxide film layer over the separation area.

* * * * *